United States Patent
Choi

(10) Patent No.: US 11,670,509 B2
(45) Date of Patent: Jun. 6, 2023

(54) TEMPLATE FOR IMPRINT LITHOGRAPHY INCLUDING A RECESSION, AN APPARATUS OF USING THE TEMPLATE, AND A METHOD OF FABRICATING AN ARTICLE

(71) Applicant: CANON KABUSHIKI KAISHA, Tokyo (JP)

(72) Inventor: Byung-Jin Choi, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 77 days.

(21) Appl. No.: 16/849,269

(22) Filed: Apr. 15, 2020

(65) Prior Publication Data

US 2020/0243328 A1   Jul. 30, 2020

Related U.S. Application Data

(62) Division of application No. 15/387,409, filed on Dec. 21, 2016, now Pat. No. 10,991,582.

(51) Int. Cl.
  *H01L 21/027*  (2006.01)
  *G03F 7/00*    (2006.01)
  (Continued)

(52) U.S. Cl.
  CPC .......... *H01L 21/0273* (2013.01); *B29C 59/00* (2013.01); *G03F 7/0002* (2013.01); *B29C 33/00* (2013.01)

(58) Field of Classification Search
  CPC ... H01L 21/00; H01L 21/02; H01L 21/02002; H01L 21/0273; H01L 21/027;
  (Continued)

(56) References Cited

U.S. PATENT DOCUMENTS 3,403,623 A    10/1968   Blackwood
5,575,962 A    11/1996   Takahashi
(Continued)

FOREIGN PATENT DOCUMENTS

JP    2006521682 A    9/2006
JP    2009066773 A    4/2009
(Continued)

OTHER PUBLICATIONS

Lue, Hang-Ting, "Charge-Trapping (CT) Flash and 3D NAND Flash", 3rd Annual SEMATECH Symposium Taiwan, Sep. 3-9, 2010, slides 1 and 29.

*Primary Examiner* — Nahida Sultana
(74) *Attorney, Agent, or Firm* — Abel Schillinger, LLP

(57) ABSTRACT

A template for imprint lithography can include a body. The body can include a base surface and have a recession extending from the base surface lying along a base plane, the recession including a main portion having a tapered sidewall. In a particular embodiment, the recession includes an intermediate portion having an intermediate sidewall. The intermediate sidewall is rounded or at least part of the intermediate sidewall lies at a different angle as compared to an average tapered angle of the main portion. In another aspect, a method of fabricating a semiconductor device can include forming a patterned resist layer having a tapered sidewall over a substrate having device layers; patterning the device layers using the patterned resist layer; and etching portions of at least some of device layers to expose lateral portions of the at least some device layers. The template is well suited for forming 3D memory arrays.

18 Claims, 6 Drawing Sheets

(51) Int. Cl.
*B29C 59/00* (2006.01)
*B29C 33/00* (2006.01)

(58) Field of Classification Search
CPC ..... H01L 21/0475; H01L 21/56; H01L 21/28; H01L 21/28008; H01L 21/27063; H01L 21/67005; H01L 21/67063; B29C 59/00; B29C 59/002; B29C 59/005; G03F 7/002; G03F 7/0038
See application file for complete search history.

(56) References Cited

U.S. PATENT DOCUMENTS

| | | | | |
|---|---|---|---|---|
| 5,670,062 | A * | 9/1997 | Lin | H01L 21/28008 |
| | | | | 216/108 |
| 5,993,724 | A | 11/1999 | Shuert | |
| 6,873,087 | B1 | 3/2005 | Choi et al. | |
| 7,157,036 | B2 | 1/2007 | Choi et al. | |
| 7,547,398 | B2 | 6/2009 | Schmid et al. | |
| 7,789,647 | B2 * | 9/2010 | Kawakami | B82Y 40/00 |
| | | | | 425/389 |
| 8,076,386 | B2 | 12/2011 | Xu et al. | |
| 8,436,356 | B2 | 5/2013 | Lee et al. | |
| 8,728,331 | B2 | 5/2014 | Jang et al. | |
| 10,058,890 | B1 | 8/2018 | Buettner et al. | |
| 10,304,682 | B2 * | 5/2019 | Hao | G02F 1/1368 |
| 10,583,586 | B2 | 3/2020 | Choi et al. | |
| 2003/0099737 | A1 * | 5/2003 | Eldridge | H01R 12/52 |
| | | | | 257/E21.582 |
| 2003/0184917 | A1 | 10/2003 | Chang et al. | |
| 2004/0137103 | A1 | 7/2004 | Lin | |
| 2004/0146792 | A1 | 7/2004 | Nimmakayala et al. | |
| 2006/0134381 | A1 | 6/2006 | Homburg et al. | |
| 2008/0164638 | A1 | 7/2008 | Zhang | |
| 2009/0200563 | A1 * | 8/2009 | Goshonoo | H01L 33/20 |
| | | | | 257/88 |
| 2009/0243126 | A1 * | 10/2009 | Washiya | B29C 37/0053 |
| | | | | 264/447 |
| 2010/0052216 | A1 | 3/2010 | Kim et al. | |
| 2010/0095862 | A1 * | 4/2010 | Miller | B82Y 10/00 |
| | | | | 101/453 |
| 2010/0252188 | A1 | 10/2010 | Inanami et al. | |
| 2011/0143271 | A1 * | 6/2011 | Koshiba | G03F 7/0002 |
| | | | | 430/30 |
| 2011/0171340 | A1 | 7/2011 | Resnick et al. | |
| 2011/0299270 | A1 | 12/2011 | Kojima et al. | |
| 2012/0138985 | A1 | 6/2012 | Ono et al. | |
| 2013/0299672 | A1 | 11/2013 | Perrier et al. | |
| 2014/0072668 | A1 | 3/2014 | Yoneda et al. | |
| 2014/0167253 | A1 * | 6/2014 | Tseng | H01L 23/3142 |
| | | | | 257/737 |
| 2014/0191331 | A1 * | 7/2014 | Price | H01L 27/11803 |
| | | | | 257/390 |
| 2015/0144960 | A1 * | 5/2015 | Saia | H01L 29/7802 |
| | | | | 257/77 |
| 2015/0224704 | A1 | 8/2015 | Cho et al. | |
| 2016/0307839 | A1 * | 10/2016 | Olson | H01L 21/3085 |
| 2016/0320696 | A1 | 11/2016 | Nishimura et al. | |
| 2017/0047306 | A1 | 2/2017 | Meitl et al. | |
| 2017/0233916 | A1 | 8/2017 | Pyun | |
| 2017/0255166 | A1 | 9/2017 | Suzuki et al. | |
| 2018/0164680 | A1 | 6/2018 | Mitra et al. | |
| 2018/0170089 | A1 | 6/2018 | Choi | |
| 2018/0202035 | A1 * | 7/2018 | Park | C23C 14/042 |
| 2018/0226419 | A1 * | 8/2018 | Hsaio | H01L 21/0273 |
| 2018/0314148 | A1 * | 11/2018 | Tetiker | G03F 1/36 |
| 2018/0342400 | A1 * | 11/2018 | Miki | H01L 29/66462 |

FOREIGN PATENT DOCUMENTS

| | | |
|---|---|---|
| JP | 2012124257 A | 6/2012 |
| JP | 2014194960 A | 10/2014 |
| KR | 20040084325 A | 10/2004 |
| KR | 20110066812 A | 6/2011 |
| KR | 20150039383 A | 4/2015 |
| WO | 2006084118 A2 | 8/2006 |
| WO | 2010064525 A1 | 6/2010 |

* cited by examiner

TEMPLATE FOR IMPRINT LITHOGRAPHY INCLUDING A RECESSION, AN APPARATUS OF USING THE TEMPLATE, AND A METHOD OF FABRICATING AN ARTICLE

CROSS-REFERENCE TO RELATED APPLICATIONS

This application is a divisional of and claims priority under 35 U.S.C. § 120 to U.S. patent application Ser. No. 15/387,409, entitled "TEMPLATE FOR IMPRINT LITHOGRAPHY INCLUDING A RECESSION, AN APPARATUS OF USING THE TEMPLATE, AND A METHOD OF FABRICATING AN ARTICLE," by Byung-Jin CHOI, filed Dec. 21, 2016, which is assigned to the current assignee hereof and incorporated herein by reference in its entirety.

FIELD OF THE DISCLOSURE

The present disclosure relates to imprint lithography, and more particularly to templates used for imprint lithography, wherein the templates have recessions, apparatuses using the templates, and methods of fabricating articles.

RELATED ART

Densities of electronic components are limited when the electronic components are laid out in a planar (two-dimensional or 2D) arrangement. Densities of electronic components can be further increased by orienting components in a vertical direction to allow for a three-dimensional or 3D arrangement. Memory devices have some of the highest electronic component densities of electronic devices. Many memory cells are arranged so that the memory cells density is as high as possible.

When the electronic components have a 3D arrangement, formation of the electronic device with such electronic components can involve many steps. In some 3D memory arrangements, a set of device layers may be formed and patterned individually or as a pair of conductive and insulating layers. For a 3D arrangement of a memory array having 32 gate electrode layers, 32 mask and etch operations may be used in patterning the gate electrode layers. The complexity increases as the number of gate electrode layers increases.

process for forming patterned layers in a 3D arrangement can include forming a very thick patterned resist layer that has vertical sidewalls. The process can alternate between discrete steps of patterning a pair of device layers and a resist erosion step. Controlling the lateral dimensions during patterning of the device layers can be challenging, and to do so in a reproducible manner may be even more challenging. A need exists to simplify the process flow, increase component density, and still achieve good reproducibility required by large volume manufacturing.

SUMMARY OF THE INVENTION

In an aspect, a template can be used in an imprint lithography process. The template comprises a body including a base surface, the body having a recession extending from the base surface lying along a base plane, the recession including a main portion having a tapered sidewall.

In an embodiment, the recession further includes a distal surface, wherein the base surface is farther to the distal surface than to the main portion; and an intermediate portion having an intermediate sidewall, wherein the main portion is disposed between the base surface and the distal surface, wherein the tapered sidewall has an average tapered angle with respect to the base plane; and the intermediate sidewall is rounded or at least part of the intermediate sidewall lies along a line that intersects the base plane at a different angle as compared to the average tapered angle.

In a particular embodiment, with respect to the base plane, the tapered sidewall of the main portion has an average tapered angle, and the intermediate sidewall lies along a line that intersects the base plane at an angle that is greater than the average tapered angle.

In another particular embodiment, the intermediate portion has a curved sidewall.

In still another particular embodiment, each of the main portion and the intermediate portions have curved sidewalls, the radius of curvature of the main portion is greater than the radius of curvature of the intermediate portion.

In a further particular embodiment, the distal surface is non-planar.

In a still another embodiment, along the main portion, the tapered sidewall lies along a line.

In a particular embodiment, the line intersects the base plane at an angle of at most 45°.

In a further embodiment, the template further comprises an aperture, wherein the recession is in fluid communication with an area outside of the template via the aperture.

In another aspect, an apparatus can be used in imprint lithography. The apparatus comprises a template including a body including a base surface, the body having a recession extending from the base surface lying along a base plane, the recession including a main portion having a tapered sidewall.

In an embodiment, the recession further includes a distal surface, wherein the base surface is farther to the distal surface than to the main portion; and an intermediate portion having an intermediate sidewall, wherein the main portion is disposed between the base surface and the distal surface, wherein the tapered sidewall has an average tapered angle with respect to the base plane; and the intermediate sidewall is rounded or at least part of the intermediate sidewall lies at a different angle with respect to the base plane as compared to the average tapered angle.

In another embodiment, the template further comprises an aperture.

In a further aspect, a method can be used to fabricate a semiconductor device, wherein the method comprises providing a substrate including device layers; forming a patterned resist layer having a tapered sidewall; patterning the device layers using the patterned resist layer, wherein the device layers have tapered sidewalls corresponding to the tapered sidewall of the patterned resist layer; and etching portions of at least some of device layers to expose lateral portions of the at least some device layers.

In an embodiment, after etching portions of the at least some device layers, the at least some device layers have substantially vertical sidewalls.

In a particular embodiment, after etching portions of the at least some device layers, other device layers have the tapered sidewalls.

In another embodiment, the method further comprises etching portions of other device layers to expose lateral portions of the other device layers.

In a particular embodiment, after etching portions of the other device layers, the device layers have substantially vertical sidewalls.

In a further embodiment, the at least some device layers are conductive device layers, and other device layers are insulating device layers; or the at least some device layers are insulating device layers, and other device layers are conductive device layers.

In a particular embodiment, the conductive device layers include gate electrodes of transistors.

In another particular embodiment, the method further comprises forming conductive plugs that land on lateral portions of the conductive device layers.

BRIEF DESCRIPTION OF THE DRAWINGS

Embodiments are illustrated by way of example and are not limited in the accompanying figures.

Figure 1:
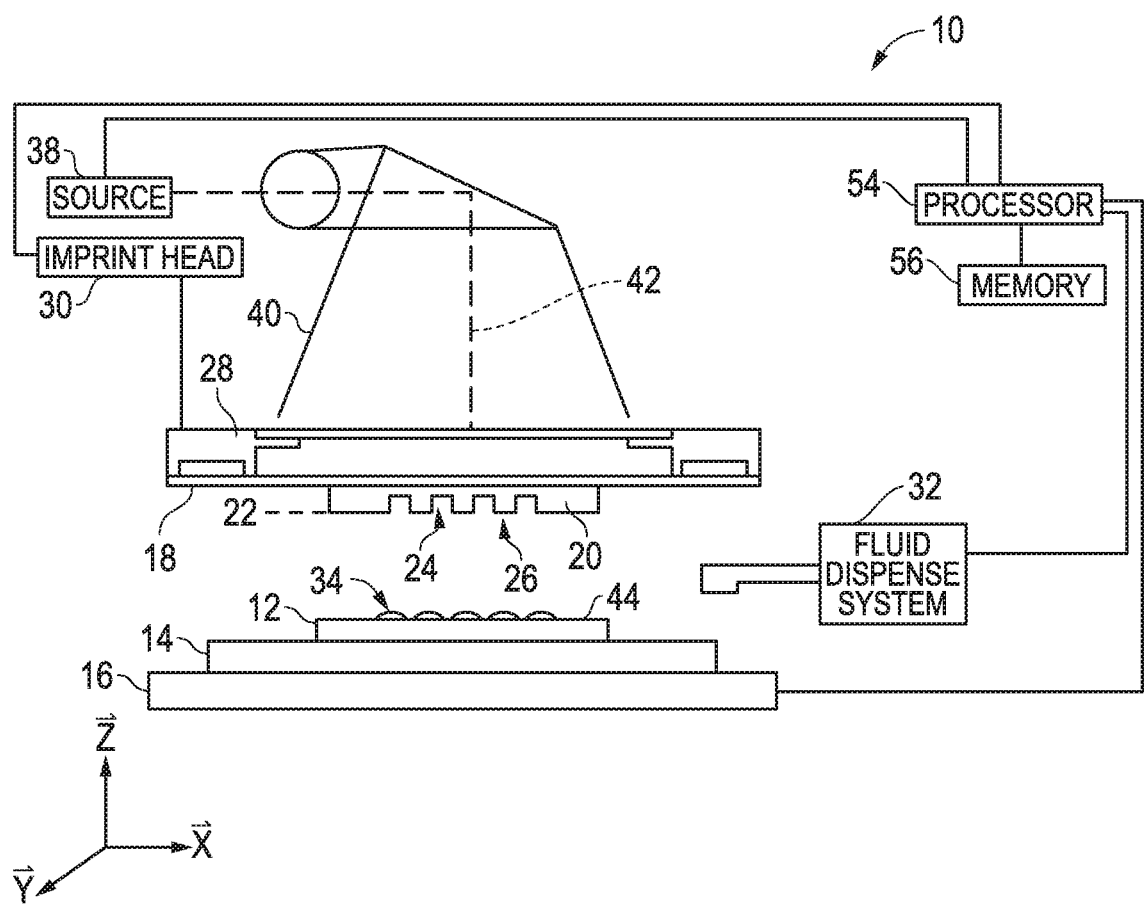
FIG. 1 includes a simplified side view of an exemplary imprint lithography system.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

As used herein, speed and motion may be described on a relative basis. For example, object A and object B move relative to each other. Such terminology is intended to cover object A is moving, and object B is not; object A is not moving, and object B is moving; and both of objects A and B are moving.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint, lithography, and semiconductor processing arts.

Templates for use in imprint lithography can be used to form a patterned resist layer having a tapered sidewall. The template can have a body that includes a base surface. The body can have a recession extending from the base surface lying along a base plane, and the recession can include a main portion having a tapered sidewall. In an embodiment, the tapered sidewall lies along a line. With respect to the base plane, the tapered sidewall of the main portion has an average tapered angle. In another embodiment, the tapered sidewall lies along a line, and in a particular embodiment, the line intersects the base plane at an angle of at most 45°, at most 30°, or at most 20°. In a particular embodiment, the thicknesses of device layers may be significantly larger than the design rules for contact opening, and thus, the line may interest the base plane at an angle of at most 10°. In a further embodiment, the tapered sidewall may have a slight curvature.

The template may include further features if needed or desired. The template may have a distal surface and an intermediate portion between the main portion and the distal surface. The intermediate portion has an intermediate sidewall. In an embodiment, a sidewall of the intermediate sidewall may be rounded. In another embodiment, the intermediate sidewall lies along a line that intersects the base plane at a different angle as compared to the average tapered angle. In a further embodiment, the main portion and intermediate portion have curved sidewalls where the radius of curvature along the main portion is greater than the radius of curvature along the intermediate portion.

Details regarding the templates and apparatuses and using the templates are better understood after reading this specification in conjunction with figures. The description below is meant to illustrate embodiments and not limit the scope of the present invention, which is defined in the appended claims.

Referring to FIG. 1, an imprint lithographic system 10 in accordance with embodiments described herein can be used to form a relief pattern on a substrate 12. The substrate 12 may be coupled to a substrate chuck 14. As illustrated, the substrate chuck 14 is a vacuum chuck; however, in other embodiments the substrate chuck 14 may be any chuck including vacuum, pin-type, groove-type, electrostatic, electromagnetic, or the like. Exemplary chucks are described in U.S. Pat. No. 6,873,087, which is hereby incorporated by reference in its entirety herein.

Substrate 12 and substrate chuck 14 may be further supported by a stage 16. The stage 16 may provide translational or rotational motion along the X-, Y-, or Z-directions. The stage 16, substrate 12, and substrate chuck 14 may also be positioned on a base (not illustrated).

Spaced-apart from the substrate 12 is a template 18. The template 18 can include a body having a first side and a second side with one side having a mesa 20 extending therefrom towards the substrate 12. The mesa 20 is sometimes referred to as a mold 20. In an embodiment, the template 18 can be formed without a mesa 20.

The template 18 or mold 20 may be formed from such materials including fused-silica, quartz, silicon, organic polymers, siloxane polymers, borosilicate glass, fluorocarbon polymers, metal, hardened sapphire, other similar materials, or any combination thereof. The template 18 and mold 20 can include a single piece construction. Alternatively, the template 18 and mold 20 can include separate components coupled together. As illustrated, a patterning surface 22 includes features defined by spaced-apart recesses 24 and protrusions 26. The disclosure is not intended to be limited to such configurations (e.g., planar surfaces). Patterning surface 22 may define any original pattern that forms the basis of a pattern to be formed on the substrate 12.

The template 18 can be coupled to a chuck 28. The chuck 28 can be configured as vacuum, pin-type, groove-type, electrostatic, electromagnetic, or another similar chuck type. Exemplary chucks are further described in U.S. Pat. No. 6,873,087. In an embodiment, the chuck 28 may be coupled to an imprint head 30 such that the chuck 28 or imprint head 30 can facilitate movement of the template 18.

The lithographic system 10 can further include a fluid dispense system 32 used to deposit a formable material 34 on the substrate 12. For example, the formable material can include a polymerizable material, such as a resin. The formable material 34 can be positioned on the substrate 12 in one or more layers using techniques such as droplet dispense, spin-coating, dip coating, chemical vapor deposition (CVD), physical vapor deposition (PVD), thin film deposition, thick film deposition, or combinations thereof. The formable material 34 can be dispensed upon the substrate 12 before or after a desired volume is dispensed between the mold 22 and the substrate 12 depending on design considerations. For example, the formable material 34 can include a monomer mixture as described in U.S. Pat. No. 7,157,036 and U.S. Pat. No. 8,076,386, both of which are herein incorporated by reference in their entireties.

The lithographic system 10 can further include an energy source 38 coupled to a direct energy 40 along a path 42. The imprint head 30 and stage 16 can be configured to position the template 18 and substrate 12 in superimposition with the path 42. The lithographic system 10 can be regulated by a logic element 54 in communication with the stage 16, imprint head 30, fluid dispense system 32, or source 38, and may operate on a computer readable program, optionally stored in memory 56.

In an embodiment, either the imprint head 30, the stage 16, or both the imprint head 30 and the stage 16 vary a distance between the mold 20 and the substrate 12 to achieve a desired volume therebetween that is filled by the formable material 34. For example, the imprint head 30 can apply a force to the template 18 such that the mold 20 contacts the formable material 34 on the substrate 12. After the desired volume is filled with the formable material 34, the source 38 can produce energy 40, e.g., ultraviolet radiation, causing the formable material 34 to solidify or cross-link conforming to a shape of the surface 44 of the substrate 12 and patterning surface 22 defining a patterned layer on the substrate 12. In this specification, attention is directed to the design of the template and recessions having a stair-step configuration.

More details of the template and forming an article are provided. In an embodiment, the article can be an electronic device fabricated on a wafer, and in a particular embodiment, the electronic device includes a 3D NAND non-volatile memory. After reading this specification, skilled artisans will appreciate that the concepts described herein can be used for other electronic devices that may or may not be memory devices. The concepts are well suited for electronic components that are connected serially or in parallel in a 3D arrangement.

Figure 2:
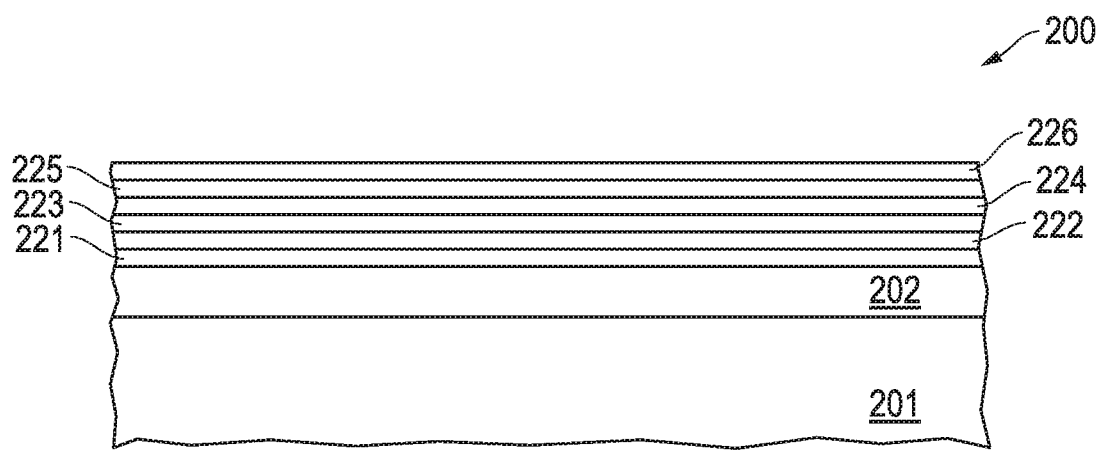
FIG. 2 includes an illustration of a cross-sectional view of a portion of a substrate including a base material, a doped region, and device layers.

FIG. 2 includes a cross-sectional view of a portion of a substrate 200 within a memory array. Although not illustrated, another part of the substrate 200 outside the memory array can include electronic components that may be part of a circuit, such as a row or column decoder, a row or column array strobe, a sense amplifier, or the like. The circuit may be formed before or after the memory cells. The substrate 200 includes a base material 201, such as a semiconductor wafer, a doped region 202, and device layers 221 to 226 overlying the doped region 202. In a NAND non-volatile memory, the doped region 202 can be source region that is shared between different memory cells that are spaced apart laterally (in the x-direction, y-direction, or both) from the memory cells being formed in FIG. 2. In the embodiment as illustrated, the device layers 222, 224, and 226 are conductive and will be gate electrodes for memory cells, and the device layers 221, 223, and 225 are insulators and electrically insulate the device layers 222, 224, and 226 from one another and the doped region 202. The device layers 222, 224, and 226 can include a doped semiconductor material, a metal-containing material (for example, a metal, a metal alloy, a metal silicide, or the like), or another material suitable for a gate electrode. The device layers 221, 223, and 225 include an oxide, a nitride, an oxynitride, or the like.

In an embodiment, the device layer 221 may include a different material as compared to the other device layers 222 to 226 and a subsequently-formed patterned resist layer. For example, the device layer 221 can include a nitride, and none of the other device layers 222 and 226 and the patterned resist layer includes a nitride. In a particular embodiment, the device layer 221 can include a nitride film and may or may not include an oxide film. For example, the device layer 221 can include an oxide film closer to the doped region 202 and a nitride film closer to the device layer 222. In another embodiment, the device layers 221, 223, and 225 can include an oxide film, and a further layer (not illustrated) may be an etch-stop layer disposed between the doped region 202 and the device layer 221.

Figure 3:
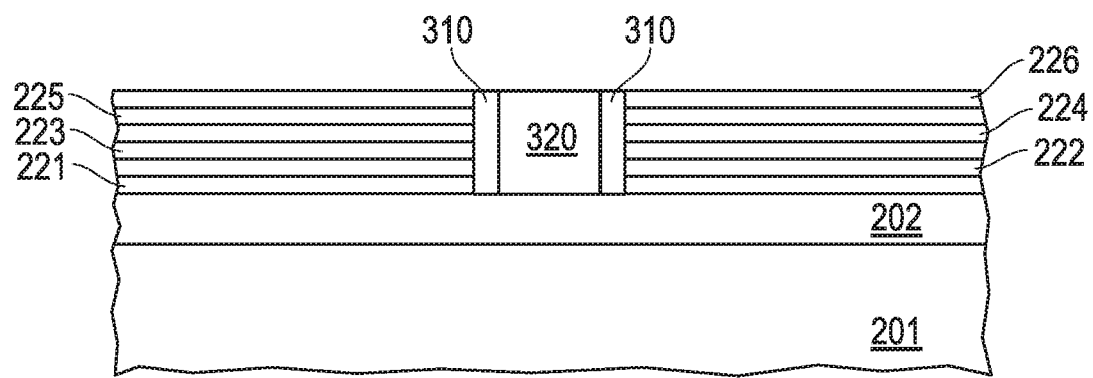
FIG. 3 includes an illustration of a cross-sectional view of the substrate of FIG. 2 after patterning the device layers and forming an insulating layer and a channel core.

The device layers 221 to 226 are patterned to define an opening. An insulating layer 310 and a channel core 320 are formed within the opening, as illustrated in FIG. 3. The insulating layer 320 can include an oxide film, a nitride film, and another oxide film. In a NAND non-volatile memory cell, charge carriers, such as electrons, can be stored or removed from charge traps within the nitride film. Thus, the insulating layer 310 can include the nitride film that is disposed between the oxide films. After deposition, portions of the insulating layer 310 overlying the device layer 226 and bottom of the opening can be removed to achieve a sidewall spacer. In a particular embodiment, the sidewall spacer shape, as illustrated in FIG. 2, is achieved by conformally depositing the films and anisotropically etching the films.

The channel core 320 can include a semiconductor material that will include the channel regions of the memory cells being formed. The channel core 320 can include a semiconductor layer and a dopant having a concentration to achieve a desired threshold voltage for the memory cells. The channel core 320 can be epitaxially grown from the doped region 202 or a semiconductor material may be deposited as an amorphous material and crystalized from the doped region 202. In another embodiment, the channel core 320 can be deposited as a polycrystalline material. If any semiconductor material is deposited over the device layer 226 when forming the channel core 302, it can be removed before continuing with patterning of the device layers 221 to 226. Although not illustrated, many other openings with sidewall spacers, including the insulating layer 310, and channel cores 320 are formed.

A template can be selected for patterning the device layers 222 to 226. The template will be used to imprint a formable material, and after curing, the formable material is converted to a patterned resist layer having a tapered sidewall. In a finished article, the patterned resist layer will be used the pattern the device layers 222 to 226 that will subsequently processed to achieve a stair-step configuration of the device layers 222 to 226. FIGS. 4 to 8 illustrate exemplary, non-limiting designs for the template to achieve a patterned resist layer having a tapered sidewall.

Figure 4:
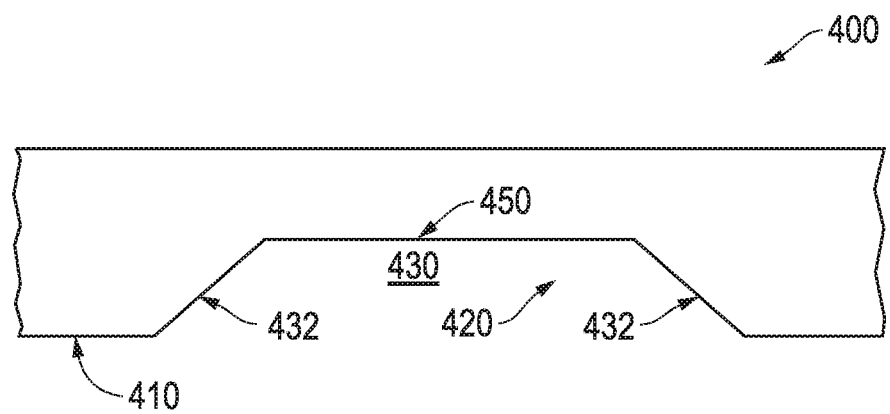
FIG. 4 includes an illustration of a cross-sectional view of a portion of a template for imprint lithography in accordance with an embodiment.

FIG. 4 includes a template 400 in accordance with an embodiment. The template 400 has a base surface 410 that lies along a base plane. The template 400 has a recession 420 that includes a main portion 430 having a tapered sidewall 432 and a distal surface 450. In the embodiment as illustrated, the tapered sidewall 432 lies along a straight line that intersects the base plane at an angle. The angle may be a function of thickness of device layers and space needed for a contact and its associated misalignment tolerance. For example, the combined thickness of a pair of conductive and insulating device layers (e.g., 225 and 226, 223 and 224, or 221 and 222) can be approximately 50 nm, and the lateral dimension for the contact and its misalignment can be 500 nm. The angle can be $\sin^{-1}$ (50 nm/500 nm), or approximately 5.7°. After reading this specification, skilled artisans will be able to determine proper angle to be used for particular set of thicknesses (vertical dimension) and contact design rules (lateral dimension).

Figure 5:
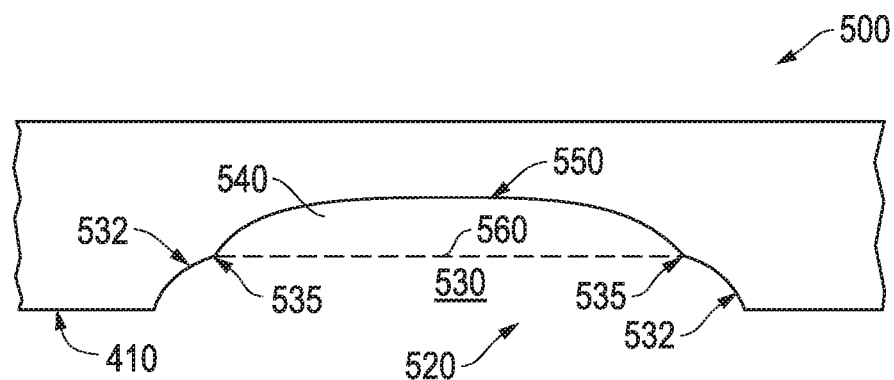
FIG. 5 includes an illustration of a cross-sectional view of a portion of a template for imprint lithography in accordance with another embodiment.

FIG. 5 includes a template 500 in accordance with another embodiment. The template 500 has a base surface 410 that lies along a base plane. The template 500 has a recession 520 that includes a main portion 530 having a tapered sidewall 532 and a distal surface 550. The main portion 530 is disposed between the base surface 410 and the distal surface 550. In the embodiment as illustrated, the tapered sidewall 532 has a slight curvature.

The part of the recession 520 below the dashed line 560 corresponds to the desired amount of patterned resist for use in patterning the device layers 221 to 226. However, a trapped void may form when gas is trapped during imprinting, the formable material may shrink when it is cured to form the patterned resist layer, another processing consideration that may affect the shape of the patterned resist layer, or any combination thereof. The recession 520 can further include an intermediate portion 540 disposed between the main portion 530 and the distal surface 550. The intermediate portion 540 can compensate for a trapped void, material shrinkage, another processing consideration, or any combination thereof. The distance between the dashed line 560 and a point along the distal surface 550 farthest from the dashed line 560, which can correspond to the depth of the intermediate portion 540, may be at least 11% of a combined thickness of a pair of underlying device layers that directly contact each other. Although there is not a theoretical upper limit on the distance, the distance may be at most the combined thickness of the device layers that will be patterned using the subsequently formed patterned resist layer. In a particular embodiment, the distance between the dashed line 560 and a point along the distal surface 550 farthest from the dashed line 560 may be in a range of 20% to 150% or 50% to 110% of a combined thickness of a pair of underlying device layers that directly contact each other.

The intermediate portion 540 has an intermediate sidewall 542. In the embodiment as illustrated, the intermediate sidewall 542 is rounded. Similar to the main portion 530, the intermediate portion 540 has a radius of curvature adjacent to a transition point 535 between the main and intermediate portions 530 and 540. The radius of curvature of the main portion 530 is greater than the radius of curvature of the intermediate portion 540.

Returning briefly to FIG. 4, similar to the template 500, the recession 420 of the template 400 may or may not have additional space to account for a trapped void, material shrinkage, another processing consideration, or any combination thereof. Thus, the recession 420 may have an intermediate portion that has an intermediate sidewall that lies along the same line as the tapered sidewall 432 of the main portion 420.

Figure 6:
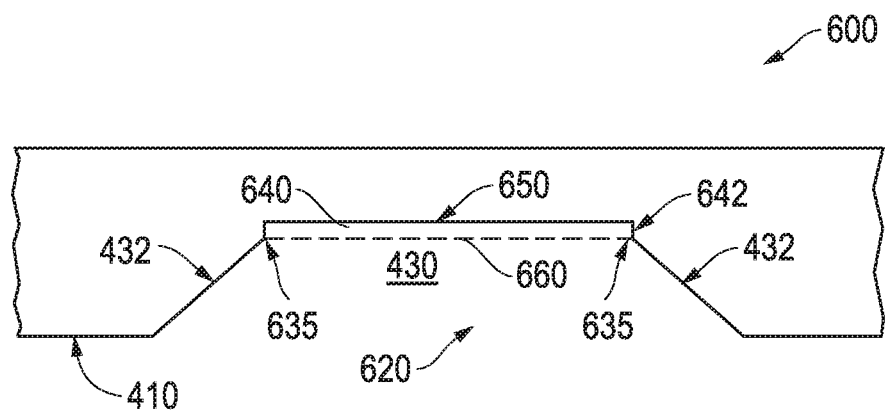
FIG. 6 includes an illustration of a cross-sectional view of a portion of a template for imprint lithography in accordance with a still another embodiment.

FIG. 6 includes a template 600 in accordance with an embodiment. The template 600 has a base surface 410 that lies along a base plane. The template 600 has a recession 620 that includes a main portion 630 having a tapered sidewall 432 and a distal surface 650. The part of the recession 620 below the dashed line 660 corresponds to the desired amount of patterned resist for use in patterning the device layers 221 to 226.

The recession 620 further includes an intermediate portion 640 disposed between the main portion 630 and the distal surface 650. Similar to template 500, the intermediate portion 640 of the template 600 can compensate for a trapped void, material shrinkage of formable material when it is cured to form the patterned resist layer. Considerations for the distance between the dashed line 660 and a point along the distal surface 650 farthest from the dashed line 660, which can correspond to the depth of the intermediate portion 640, are above described with respect to the intermediate portion 540. Thus, the distance between the dashed line 660 and a point along the distal surface 650 farthest from the dashed line 660 may have any of the values as previously described with respect to FIG. 5.

In the embodiment as illustrated, the tapered sidewall 432 lies along a straight line that intersects the base plane at an angle. Considerations for the angle are described with respect to FIG. 4. The intermediate portion 640 has an intermediate sidewall 642 that meets the tapered sidewall 432 of the main portion 630 at a transition point 635. The intermediate sidewall 642 lies along a line that intersects the base plane at a different angle that the angle at the intersection of the line corresponding to the tapered sidewall 432 and the base plane. In a particular embodiment, the intermediate sidewall 642 is substantially vertical. As used herein, substantially vertical means that the sidewall is within 10° of perpendicular to the base plane. With respect to the base plane, the angle corresponding to the intermediate sidewall 642 is greater than the average tapered angle corresponding to the tapered sidewall 432.

Figure 7:
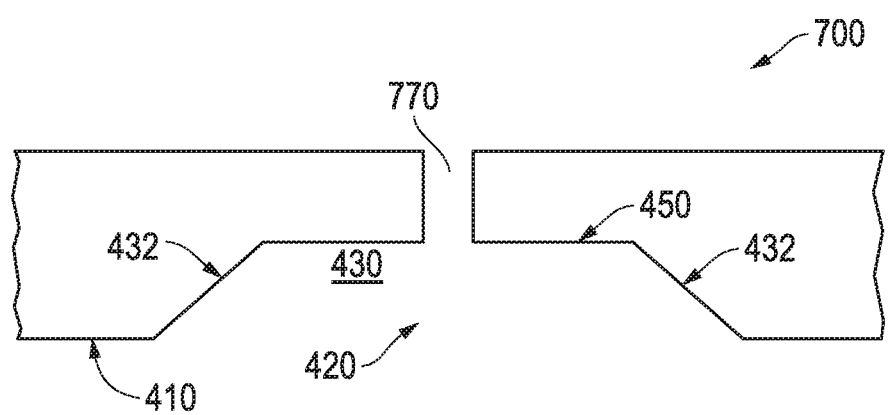
FIG. 7 includes an illustration of a cross-sectional view of a portion of a template for imprint lithography in accordance with a yet another embodiment.
Figure 8:
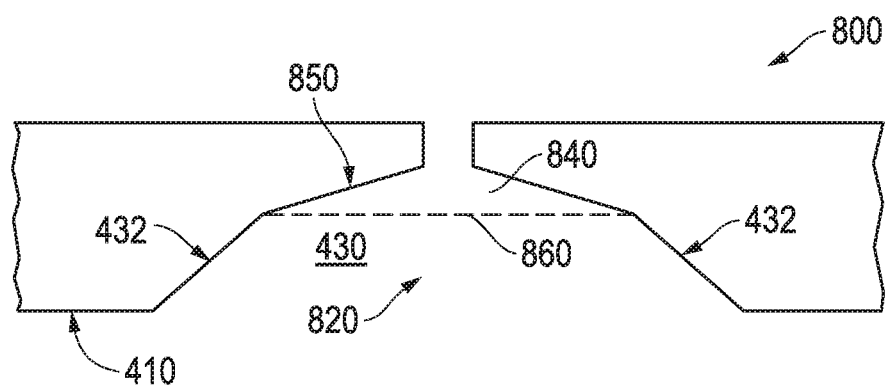
FIG. 8 includes an illustration of a cross-sectional view of a portion of a template for imprint lithography in accordance with a further embodiment.

FIG. 7 includes a template 700 in accordance with another embodiment. The template 700 is similar to the template 400 except the template 700 has an aperture 770 extending from the recession 420 to allow the recession 420 to be in fluid communication with an area outside of the template 700. FIG. 8 includes a template 800 in accordance with a further embodiment. The template 800 is similar to the template 700 except a recession 820 of the template 800 has an intermediate region 840 between the dashed line 860 and a distal surface 850. In an embodiment, the distal surface 850 is an intermediate sidewall of the intermediate portion 840. In the embodiment as illustrated, the distal surface 850 extends from a transition point 835 between the main and intermediate portions 430 and 840 to an aperture 870.

While many different embodiments of templates have been described, after reading this specification, skilled artisans will appreciate that other embodiments can be used consistent with the concepts as described herein. For example, features of different embodiments illustrated can be mixed and matched. For example, the main portion 430 in FIGS. 4 and 6 to 8 may have a slight curvature similar to the main portion 530. The templates 500 and 600 can include apertures that connect the recessions 520 and 620 to areas on the opposite sides of the templates. Further, any of the templates may have rounded corners immediately adjacent to the base surface 410 to aid in flowing the formable material or another reason. Thus, the main portion 420 or 520 may extend to the base surface 410 (as illustrated) or may be adjacent but spaced apart from the base surface 410. In a particular embodiment, the main portion 420 or 520 may be vertically spaced apart (in a direction perpendicular to the base plane) from the base surface 410 by no more than 10% of the depth of the recession 420, 520, 620, or 820 at its deepest location (measured in a vertical direction). In an embodiment, the apertures 770 and 870 are not parts of the recessions 420 and 820, respectively. Skilled artisans will be able to determine a particular design for a template for the needs or desires for a particular application.

Figure 9:
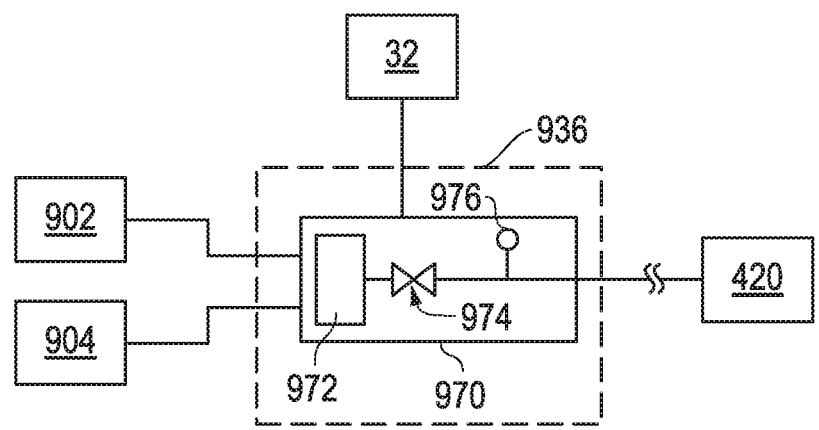
FIG. 9 includes a depiction of a gas flow controller in relationship to pressure sources, an aperture of the template of FIG. 4, and a processor.

When a template includes an aperture, the pressure within the recession may be controlled during imprinting a formable material with the template, separating a patterned resist layer from the template, or both. FIG. 9 includes a depiction of a gas flow controller 936 in relationship to pressure sources, the template 700, and a processor. In another embodiment, the configuration and operation of the gas flow controller 936 described below can be used with the template 800. For simplicity, the configuration and operation are described with respect to the template 700.

Referring to FIGS. 1, 7 and 9, the recession 420 is in fluid communication with the gas controller 936 via the aperture 770. The gas controller 936 is in fluid communication with a vacuum (negative pressure) source 902 and a (positive) pressure source 904. Although not illustrated, the gas controller 936 can allow the recession 420 to be at ambient pressure, too. The gas controller 936 includes a control unit 970 that include a pressure source selector 972, a valve or other pressure control mechanism 974, and a pressure sensor 976. The gas controller 936 is coupled to the processor 54 (FIG. 1). Logic for operating the gas controller 936 may be within gas controller 936, the processor 54, or both. In a particular embodiment, the recession 420 may be set to a vacuum set point or a pressure set point. The pressure source selector 972 can select the desired source 902 or 904, and the valve 974 can be adjusted so that the pressure, as sensed by the pressure sensor 976, is the same as or within a predetermined tolerance of the set point.

During an imprinting operation, a vacuum may help to guide air toward the aperture 770 of the template 700. In another embodiment, the side of the template 700 opposite the recession 420 may be at ambient pressure during imprinting. The aperture 770 can allow trapped air to more easily leave the recession 420 as compared to the recession 420 of the template 400 that does not have an aperture. After curing the formable material to form the patterned resist layer, pressure may be applied via the pressure source 904 to aid in separating the template 700 from the patterned resist layer formed from the formable material.

Figure 10:
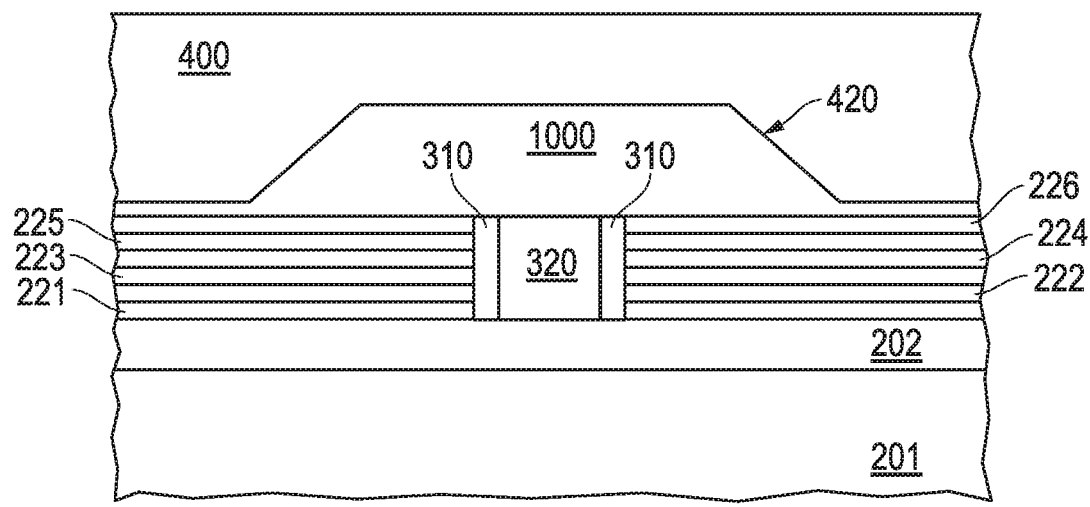
FIG. 10 includes an illustration of a cross-sectional view of the substrate of FIG. 3 and the template of FIG. 4 during imprinting a formable material.

The method of fabricating the article continues and will be processed using the template 400 in FIG. 4. Referring to FIGS. 1, 3, and 10, the substrate as illustrated in FIG. 3 is placed on and held in position by the substrate chuck 14. The fluid dispense system 32 and substrate are positioned relative to each other. The processor 54 sends an instruction to the fluid dispense system 32 that dispenses or otherwise forms the formable material over the device layer 226, the insulating layer 310, and the channel core 320 at proper areal densities to fill recessions within the mold. In the particular embodiment, the template 400 with the recession 420 is used to imprint the formable material 1000. The substrate and template are moved closer to each other, and the template contacts the formable material. Referring to FIG. 10, the movement continues, and the formable material 1000 fills the recession 420 and other recessions (not illustrated) in the template 400.

Figure 11:
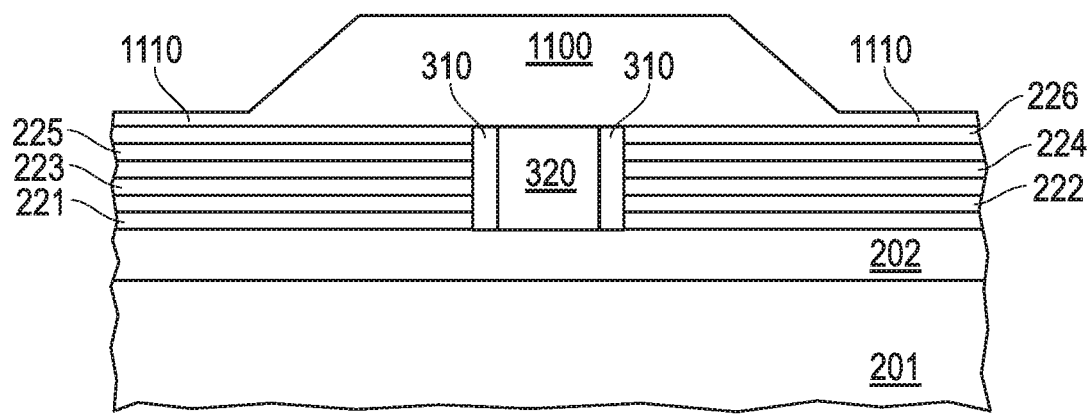
FIG. 11 includes an illustration of a cross-sectional view of the substrate of FIG. 10 after forming a patterned resist layer from the formable material and removing the template.

The method can include curing the formable material 1000 to form a patterned resist layer 1100 in FIG. 11 corresponding to the pattern surface of the template 400. Curing can be performed by exposure to electromagnetic radiation. In an embodiment, the electromagnetic radiation can be ultraviolet radiation. In another embodiment, the formable material can be cured using heat. Portions of the patterned resist layer 1100 that were formed between the substrate and the base surface 410 of the template 400 form the residual layer 1110. After curing, the template 400 is separated from the patterned resist layer 1100 that has a tapered sidewall 1132 as illustrated in FIG. 11.

Figure 12:
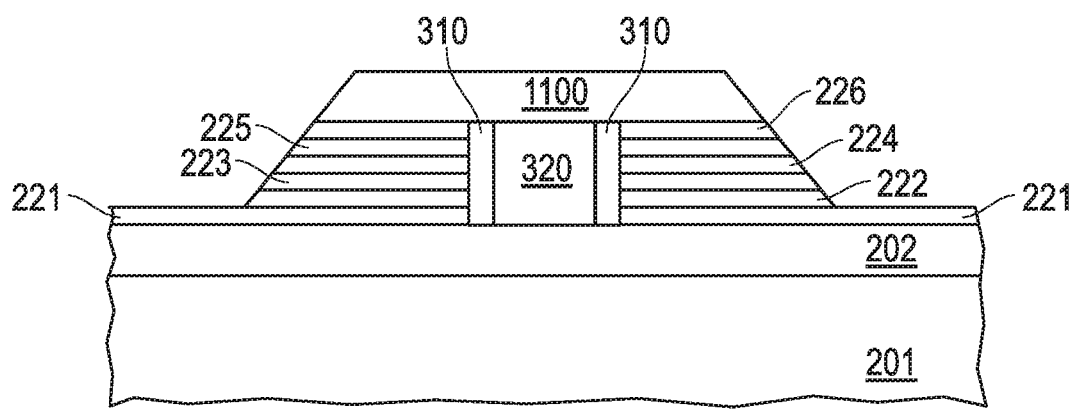
FIG. 12 includes an illustration of a cross-sectional view of the substrate of FIG. 11 after removing a residual layer of a patterned resist layer and initial patterning device layers.

The patterned resist layer 1100 can be used to pattern initially the underlying device layers 222 to 226, as illustrated in FIG. 12. In the embodiment as illustrated, the device layer 221 has a composition different from the other device layers 222 to 226 and the patterned resist layer 1100.

Thus the device layer 221 can be an etch-stop layer for the etch during initial patterning of the device layers 222 to 226. After patterning, the device layers 222 to 226 have tapered sidewalls corresponding to the tapered sidewall 1132 of the patterned resist layer 1100.

During a first portion of the patterning sequence, the residual layer 1110 can be ashed using an $O_2$ plasma. The ashing can be performed as a timed etch, endpoint detection, or endpoint detection and a timed overetch.

During a second portion of the patterning sequence, Portions of the device layers 222 to 226 are patterned as the patterned resist layer 1100 is eroded. The patterned resist layer 1100 can be etched using an $O_2$ plasma, when the insulating device layers 223, and 225 includes a silicon oxide, the etch chemistry can include $CHF_3$, and when the device layer 226 includes polycrystalline or amorphous silicon, the etch chemistry can include HBr with or without $O_2$. Other etching gases or other gases (e.g., CO, Ar, etc.) may be used if needed or desired. The etching can be performed anisotropically using reactive ion etching.

The etch chemistry can be selected to achieve a desired selectivity between the patterned resist layer 1100 and the device layers 222 to 226 to that all layers can be etched simultaneously. In a particular embodiment, the etch selectivity of the patterned resist layer 1100 to the insulating device layers 223 and 225, which may include a silicon oxide, to the conductive device layers 222, 224, and 226, which may include amorphous or polycrystalline silicon may be close to X:Y:Z, wherein X is the relative etch selectivity of the patterned resist layer 1100, Y is the relative etch selectivity of the insulating device layers 223 and 225, and Z is the relative etch selectivity of the conductive device layers 222, 224, and 226.

The values for X, Y, and Z can be determined by dividing the etch rate for a particular type of layer (e.g., the insulating device layers 223 and 225) by the average etch rate for the different types of layers being etched. For example, when using a particular etch chemistry, the etch rate of the patterned resist layer 1100 is 450 nm/min., the etch rate of insulating device layers 223 and 225 is 550 nm/min., and the etch rate of the conductive device layers is 500 nm/min. Thus, the average etch rate for the three different types of layers is 500 nm/min. Accordingly, in this particular example, X:Y:Z is (450 nm/min.÷500 nm/min.):(550 nm/min.÷500 nm/min.):(500 nm/min.÷500 nm/min.), or more simply, 0.9:1.1:1.0. In an embodiment, each of X, Y, and Z is in a range of 0.8 to 1.2, and in a more particular embodiment, 0.9 to 1.1. In another embodiment, the ratios for the relative etch selectivities may be outside the ranges described.

After the etch chemistry has been selected, the patterned resist layer 1100 and the device layers 222 to 226 are etched to provide the structure as illustrated in FIG. 12. The etch is performed such that the tapered sidewall 1132 of the patterned resist layer 1100 is replicated into the device layers 222 to 226, such that each of the device layers 222 to 226 has a tapered sidewall. The etch may be performed as a timed etch, endpoint detection, or endpoint detection with a timed overetch. A signal based on the nitride of the device layer 221 may be used for endpoint detection. The etch may be performed anisotropically or isotropically. In a particular embodiment, the etch is performed using reactive ion etching.

In another embodiment, the etching of the device layers 222 to 226 may be performed using ion milling or sputter etching, both of which are characterized by low selectivity, meaning the etch rate of different materials are closer to one another as compared to plasma etching or reactive ion etching. Thus, the etch may be more difficult to stop on the device layer 221 as compared to an etch performed as reactive ion etching. Endpoint detection can be used when the device layer 221 has a different composition as compared to the other device layers 221 to 226.

In another embodiment (not illustrated), the device layer 221 may be patterned along with the other device layers to achieve a tapered sidewall. For example, the insulating device layers 221, 223, and 225 may have the same composition, such as an undoped silicon oxide. In this embodiment, endpoint detection can be used if the doped region 202 includes a material different from the device layers 221 to 226 and the patterned resist layer 1100. For example, the doped region 202 includes arsenic doped monocrystalline silicon, and the conductive device layers 222, 224, and 226 include boron or phosphorus doped polycrystalline silicon. Endpoint detection may be based on a signal corresponding to arsenic. Some care may be exercised as the dry etch rate of polycrystalline silicon is similar to monocrystalline silicon, regardless of dopant. In an embodiment, the etching conditions can be altered to reduce the etch rate after arsenic is detected should an overetch following endpoint detection be used. After reading this specification, skilled artisans will be able to determine whether the device layer 221 is to be etched, the etching technique (plasma etching, reactive ion etching, ion milling or sputter etching), and whether the etch is to be performed as a timed etch, endpoint detection, or endpoint detection with a timed overetch.

Figure 13:
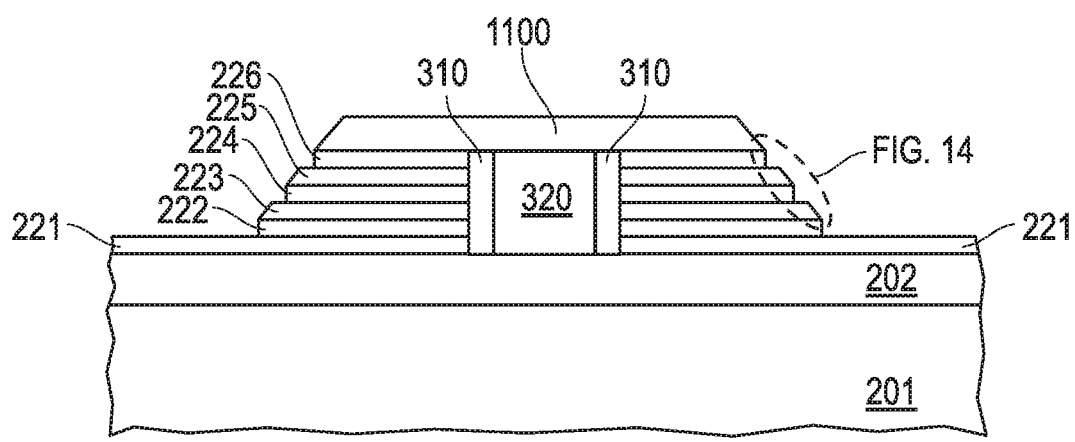
FIG. 13 includes an illustration of a cross-sectional view of the substrate of FIG. 12 after etching some of the device layers.
Figure 14:
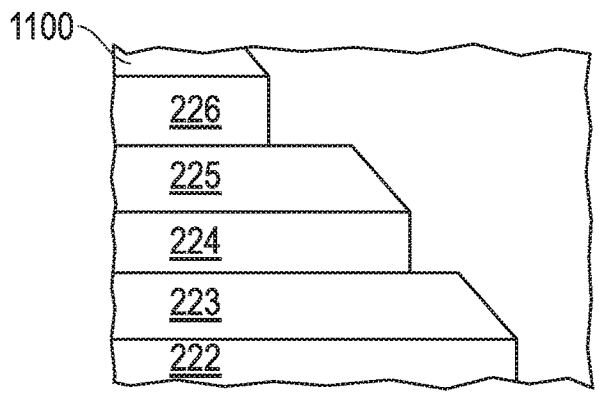
FIG. 14 includes an illustration of an enlarged portion of a portion of FIG. 13.

Additional portions of the etch sequence can etch the conductive device layers 222, 224, and 226 separately from the insulating device layers 223 and 225 to achieve a stair-step configuration of layers 222 to 226. In particular, the etch chemistry used for achieving the tapered sidewall for the device layers 222 to 226 is terminated, and an etch chemistry that can selectively etch the conductive device layers 222, 224, and 226 as compared to the patterned resist layer 1100 and the device layers 223 and 225 is used to remove exposed portions of the conductive device layers 222, 224, and 226, as illustrated in FIGS. 13 and 14. The etch can be performed using an anisotropic etch to maintain better pattern fidelity. In an embodiment, when the conductive device layers 222, 224, and 226 include polycrystalline or amorphous silicon, the etch chemistry can include HBr with or without $O_2$. The etch can be performed using an anisotropic etch to maintain better pattern fidelity. FIG. 14 includes an enlarged portion of FIG. 13 to illustrate better the substrate after etching the conductive device layers 222, 224, and 226 to expose lateral (horizontal) surfaces of the insulating device layers 221, 223, and 225. The conductive layers 222, 224, and 226 have substantially vertical sidewalls. At this point in the process, the device layers 223 and 225 still have tapered sidewalls. In an embodiment, none of the conductive device layers 222, 224, and 226 can be seen from a top view of the substrate.

Figure 15:
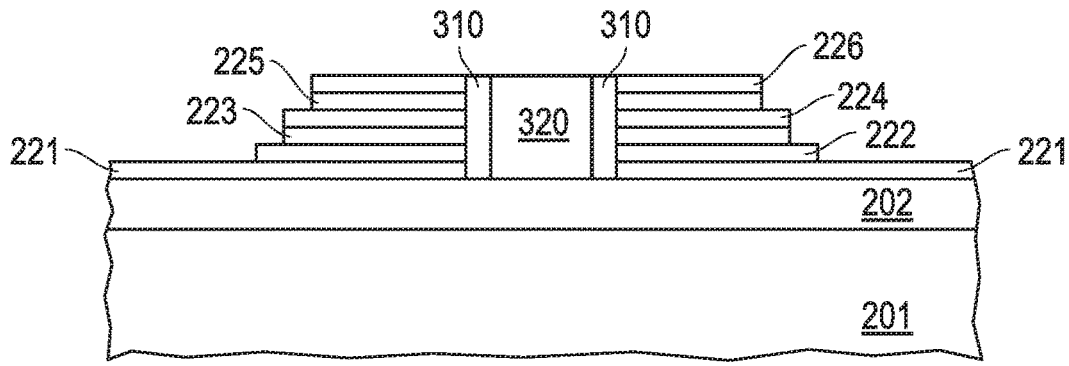
FIG. 15 includes an illustration of a cross-sectional view of the substrate of FIG. 13 after etching other device layers.

Further portions of the etch sequence can be used to expose portions of the conductive layers 222, 224, and 226, as illustrated in FIG. 15. An etch chemistry that can selectively etch the insulating device layers 223 and 225 as compared to the patterned resist layer 1100 and the conductive device layers 222 and 224 is used to remove exposed portions of the conductive device layers 222 and 224. The etch can be performed using an anisotropic etch to maintain better pattern fidelity. In an embodiment, when the insulating device layers 223 and 225 include an oxide, the etch chemistry can include $CHF_3$. The etch can be performed using an anisotropic etch to maintain better pattern fidelity.

After etching the insulating device layers 223 and 225 to expose lateral (horizontal) surfaces of the conductive device layers 222 and 224. Any remaining portion of the patterned resist layer 1100 is removed by ashing to expose the conductive device layer 226. The insulating layers 223 and 225 have substantially vertical sidewalls. In an embodiment, none of the insulating device layers 223 and 225 can be seen from a top view of the substrate. As seen in FIG. 15, the device layers 225 and 226 form a step, the device layers 223 and 224 form another step, and the device layer 222 forms a further step. In another embodiment where the device layer 221 is patterned (not illustrated), the device layers 221 and 222 are parts of the same step. Thus, the patterning that originally forms a tapered sidewall in the device layers 222 to 226 can be converted to a stair-step configuration.

The process of patterning the device layers 222 to 226 is simplified when the conductive device layers 222, 224, and 226 have the same composition and substantially the same thickness, and insulating device layers 223 and 225 have the same composition and substantially the same thickness. As used herein "substantially the same thickness" means that the thicknesses are within 10% of each other.

Figure 16:
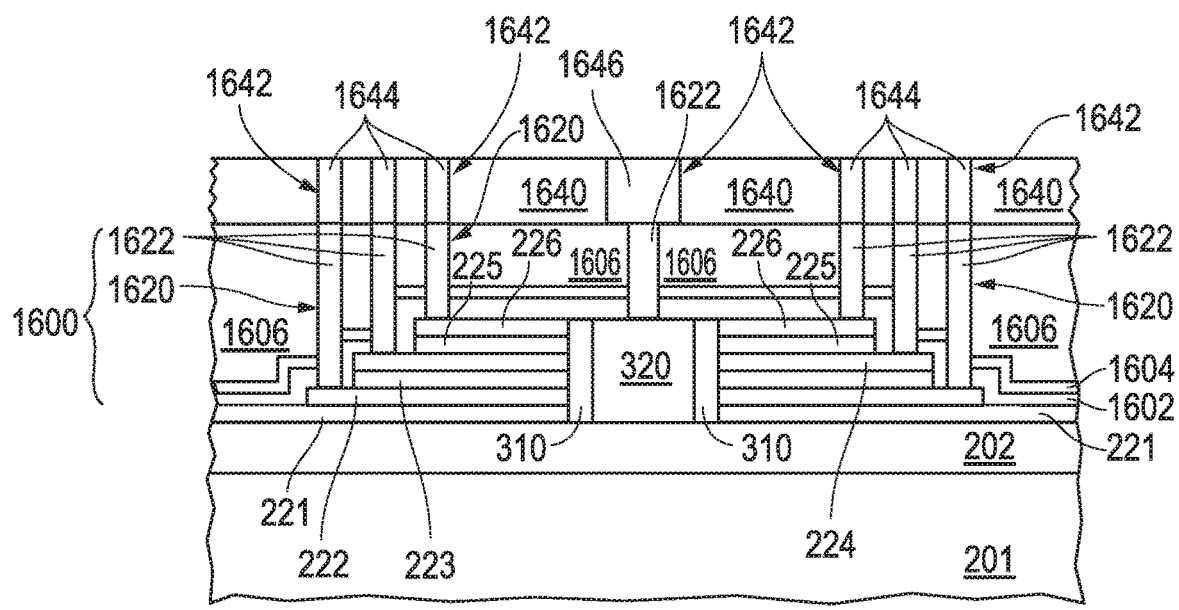
FIG. 16 includes an illustration of a cross-sectional view of the substrate of FIG. 14 after forming a substantially completed article.

Further processing is performed to form a substantially completed article, as illustrated in FIG. 16. An interlevel dielectric (ILD) layer 1600 is formed over the substrate, including the patterned device layers 221 to 226. In an embodiment, the ILD layer 1600 may include a plurality of films. For example, the ILD layer 1600 can include an undoped oxide film 1602, an etch-stop film 1604, and a doped oxide film 1606. The layers can be sequentially deposited and polished. As can be seen in FIG. 16, the thickness of the doped oxide film 1606 has a thickness that significantly differs between locations. The etch-stop film 1604 helps in providing a more controlled etch of the doped oxide film 1606 for contacts to the conductive device layers 222, 224, and 226 and to other parts of the article. The etch-stop film 1604 can include a nitride layer. The etch can be performed using endpoint detection or a combination of endpoint detection and a timed over etch. As compared to the doped oxide film 1606, the films 1602 and 1604 are relatively thinner and have more uniform thicknesses, and thus, they are sequentially etched without any significant complication. The patterned ILD layer 1600 has contact openings 1620. In another embodiment, more or fewer films can be used in the patterned ILD layer 1600, the compositions of the films 1602, 1604, and 1606 may be different from those previously described. After reading this specification, skilled artisans will appreciate that the number of films and their compositions of the ILD 1600 can be tailored for the needs or desires for a particular application.

Conductive plugs 1622 can be formed within the contact openings 1620. An insulating layer 1640 can be formed and patterned to form interconnect trenches 1642, and interconnects 1644 and 1646 can be formed within the interconnect trenches. The interconnects 1644 are electrically connected to the device layers 222, 224, and 226 via the conductive plugs 1622. The interconnects 1644 provide signals to the gate electrodes of the memory array in the embodiment as illustrated in FIG. 16. The interconnect 1646 is electrically connected to the channel core 320. Thus, the interconnect 1646 is part of a bit line for the memory array.

In another embodiment, a memory array includes more device layers and more channel cores coupled to the device layers. The channel cores may be arranged in a staggered arrangement along adjacent rows to allow for a more densely packed memory array. In a further embodiment, the order of patterning the device layers 221 to 226 with respect to the channel core 320 and forming landing regions for conductive plugs 1622 can be reversed. The device layers 221 to 226 may be patterned to achieve the stair-step configuration before patterning the device layers 221 to 226 for the insulating layer 310 and channel core 320.

Other types of electronic components may be formed using the techniques as described herein. In particular, functions of the device layers 222, 224, and 226 and channel core 320 may be changed. For example, the device layers 222, 224, and 226 can be in the form of channel regions of transistors, and the channel core 320 may be replaced by a gate electrode. In a particular example, the transistors may be depletion-mode transistors, and the gate electrode may be a common gate electrode for the transistors. Such a configuration may be useful when channel regions of transistors correspond to the device layers 222, 224, and 226, which may be electrically connected to different components, are to be turned on or turned off together. Such a configuration may be useful when a signal (on the common gate electrode) is used by different circuits simultaneously.

The templates as described herein are useful for patterning many device or other layers of an article using the same patterned resist layer formed using imprint lithography. The template can be designed so that trapped voids, material shrinkage of a formable material, another processing consequence affecting thickness of a patterned resist layer, or any combination thereof does not resulting patterning of an upper device layer at an unintended location. Accordingly, the template allows for a more robust patterning sequence used in manufacturing when patterning several device layers using as little as a single patterned resist layer. The templates are useful in the formation of 3D memory arrays and other electronic components.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method of fabricating a semiconductor device comprising:
   providing a substrate including device layers;
   forming a patterned resist layer having a tapered sidewall with a template having a tapered sidewall;
   patterning the device layers using the patterned resist layer, wherein the device layers have tapered side walls corresponding to the tapered sidewall of the patterned resist layer; and
   etching portions of at least some of device layers to expose lateral portions of the at least some device layers, wherein the template comprises:
      a body with a first surface and a second surface, wherein the second surface is opposite the first surface, the body having a recession extending from the first surface lying along a base plane, wherein the recession comprises:
         a main portion having the tapered sidewall;
         a distal surface within the recession; and
         an aperture that extends from the distal surface to the second surface.

2. The method of claim 1, wherein after etching portions of the at least some device layers, the at least some device layers have substantially vertical sidewalls.

3. The method of claim 2, wherein after etching portions of the at least some device layers, other device layers have the tapered sidewalls.

4. The method of claim 1, further comprising etching portions of other device layers to expose lateral portions of the other device layers.

5. The method of claim 4, wherein after etching portions of the other device layers, the device layers have substantially vertical sidewalls.

6. The method of claim 1, wherein:
   the at least some device layers are conductive device layers, and other device layers are insulating device layers; or
   the at least some device layers are insulating device layers, and other device layers are conductive device layers.

7. The method of claim 6, wherein the conductive device layers include gate electrodes of transistors.

8. The method of claim 6, further comprising forming conductive plugs that land on lateral portions of the conductive device layers.

9. The method of claim 1, further comprising:
   depositing formable material on the device layers;
   contacting the formable material with a template; and
   curing the formable material on the device layers to form the patterned resist layer having the tapered sidewall.

10. The method of claim 9, further comprising separating the template and the patterned resist layer having the tapered sidewall after curing the formable material on the device layers to form the patterned resist layer having the tapered sidewall.

11. The method of claim 6, further comprising selecting an etch chemistry, wherein the etch chemistry is selected using the formula X: Y: Z, wherein X is the relative etch selectivity of the patterned resist layer, Y is the relative etch selectivity of the insulating device layers, and Z is the relative etch selectivity of the conductive device layers.

12. The method of claim 11, wherein each of X, Y, and Z is between 0.8 to 1.2.

13. The method of claim 11, wherein each of X, Y, and Z is between 0.9 to 1.1.

14. A method of fabricating a semiconductor device comprising:
   providing a substrate including device layers;
   depositing a formable material on the device layers;
      contacting the formable material with a template having a tapered sidewall;
   curing the formable material to form a patterned resist layer having a tapered sidewall corresponding to the tapered sidewall of the template;
   patterning the device layers using the patterned resist layer, wherein the device layers have tapered sidewalls corresponding to the tapered sidewall of the patterned resist layer; and
   etching portions of at least some of device layers to expose lateral portions of the at least some device layers,
   wherein the template comprises:
      a body with a first surface and a second surface, wherein the second surface is opposite the first surface, the body having a recession extending from the first surface lying along a base plane, wherein the recession comprises:
         a main portion having the tapered sidewall;
         a distal surface within the recession; and
         an aperture that extends from the distal surface to the second surface.

15. The method of claim 14, wherein the main portion is disposed between the first surface and the distal surface of the recession.

16. The method of claim 14, wherein the recession further comprises an intermediate portion having an intermediate sidewall.

17. The method of claim 14, further comprising filling the recession of the template with the formable material.

18. A method of fabricating a semiconductor device comprising:
   providing a substrate including device layers;
   forming a patterned resist layer having a tapered sidewall with a template having a tapered sidewall;
   patterning the device layers using the patterned resist layer, wherein the device layers have tapered sidewalls corresponding to the tapered sidewall of the patterned resist layer;
   etching portions of at least some of device layers to expose lateral portions of the at least some device layers; and
   forming an inter-level dielectric layer over the substrate including the patterned device layers,
   wherein the template comprises:
   a body with a first surface and a second surface, wherein the second surface is opposite the first surface, the body having a recession extending from the first surface lying along a base plane, wherein the recession comprises:
   a main portion having the tapered sidewall;
   a distal surface within the recession; and
   an aperture that extends from the distal surface to the second surface.

\* \* \* \* \*

UNITED STATES PATENT AND TRADEMARK OFFICE
CERTIFICATE OF CORRECTION

| | | |
|---|---|---|
| PATENT NO. | : 11,670,509 B2 | Page 1 of 1 |
| APPLICATION NO. | : 16/849269 | |
| DATED | : June 6, 2023 | |
| INVENTOR(S) | : Byung-Jin Choi | |

It is certified that error appears in the above-identified patent and that said Letters Patent is hereby corrected as shown below:

On the Title Page

Insert under U.S. Patent Documents in item (56):
--20160170306 A1 2016-06-16 Lima et al.--
And
--2016172624 A1 2016-06-16 Fukuda et al.--

Signed and Sealed this
Twenty-ninth Day of July, 2025

Coke Morgan Stewart
*Acting Director of the United States Patent and Trademark Office*